United States Patent [19]
Mannerstråle

[11] Patent Number: 6,078,228
[45] Date of Patent: Jun. 20, 2000

[54] ARRANGEMENT AND METHOD FOR PHASE SHIFTING SIGNALS IN A TELESYSTEM

[75] Inventor: Jacob Mannerstråle, Gunnesbouāgen, Sweden

[73] Assignee: Telefonaktiebolaget LM Ericsson, Stockholm, Sweden

[21] Appl. No.: 08/854,680

[22] Filed: May 12, 1997

[30] Foreign Application Priority Data

May 22, 1996 [SE] Sweden .................................. 9601945

[51] Int. Cl.[7] .................................. H01P 1/18; H01P 9/00
[52] U.S. Cl. ........................ 333/139; 333/140; 333/156; 333/164
[58] Field of Search .................................. 333/156, 164, 333/161, 139, 140

[56] References Cited

U.S. PATENT DOCUMENTS

| | | | |
|---|---|---|---|
| 4,056,792 | 11/1977 | Horwitz et al. | 333/156 |
| 4,549,152 | 10/1985 | Kumar | 333/164 X |
| 4,599,585 | 7/1986 | Vorhaus et al. | 333/156 X |
| 4,647,789 | 3/1987 | Upadhyayula | 307/262 |
| 4,806,888 | 2/1989 | Salvage et al. | 333/138 |
| 4,965,866 | 10/1990 | Martineau | 333/161 X |
| 5,006,823 | 4/1991 | Baril et al. | 333/164 |
| 5,039,959 | 8/1991 | Young | 332/105 |
| 5,116,807 | 5/1992 | Romanofsky et al. | 333/161 X |
| 5,119,050 | 6/1992 | Upshur et al. | 333/164 |
| 5,317,290 | 5/1994 | Jacomb-Hood | 333/161 |
| 5,334,959 | 8/1994 | Krafcsik et al. | 333/164 |
| 5,680,417 | 10/1997 | Carlson | 333/164 X |

FOREIGN PATENT DOCUMENTS

| | | |
|---|---|---|
| 226154 | 6/1987 | European Pat. Off. . |
| 422417 | 4/1991 | European Pat. Off. . |
| 1406667 | 6/1988 | U.S.S.R. .................................. 333/164 |

OTHER PUBLICATIONS

International Search Report re PCT/SE97/00621; Date of mailing of Search Report: Jul. 21, 1997.

W. Mielke, "An Active Phase Shifter for Phase Array Applications Providing Amplitude and Phase Control", 15th Europ. Microw. Conference (Sep. 9–13, 1985) Paris, France, XP002031612, pp. 572–577.

International–Type Search Report Re SE96/00590 Date of mailing of search report: Apr. 4, 1997.

*Primary Examiner*—Robert Pascal
*Assistant Examiner*—Barbara Summons
*Attorney, Agent, or Firm*—Burns, Doane, Swecker & Mathis, L.L.P.

[57] ABSTRACT

A phase shifting electric circuit (1) comprises units for conveying an input signal (V1) from a main signal input (12) to a main signal output (11). The circuit (1) has a first signal path (18), from the input (12) to the output (11), along which a connectable and disconnectable first active unit (3) is arranged and also a second signal path (19) along which a connectable and disconnectable second active unit (4) and a 180 degrees phase shifting unit (2) are arranged. By a method a selection is made which of the active units (3,4) is to be in a connected condition after which control signals (U1,U2) to the units (3,4) sets them in a connected and disconnected condition respectively with the outcome of a transmission from the output (11), depending on the selection, either a non-phase shifted signal (V1') or a 180 degrees phase shifted signal (V2'). Depending on the function of the active units (3,4) the signal (V1',V2') can also be affected in other respects than its relative phase.

12 Claims, 4 Drawing Sheets

ARRANGEMENT AND METHOD FOR PHASE SHIFTING SIGNALS IN A TELESYSTEM

TECHNICAL FIELD OF THE INVENTION

The present invention relates to arrangements that in a first condition shifts the phase of an alternating current signal, and in a second condition forwards the signal without phase shift. In particular, the invention relates to circuits that enable simultaneous influence, other than phase shift, of the signal. Further, the invention relates to methods of simultaneous phase shift and active influence on a signal when using an arrangement according to the invention.

DESCRIPTION OF RELATED ART

In certain electric signal processing units there are for example functional requirements that it should be possible to add and subtract, in arbitrary combinations, alternating current signals from a number of different external signal sources. A subtraction of a signal from another signal is preferably done by adding one signal to a version of the other signal having opposite phase. Thus, it is required of these signal processing units that they should be able to shift the relative phase of the signals by 180 degrees.

A 180 degrees phase shifting circuit is described in U.S. Pat. No. 5,334,959. Four field effect transistors act as current switches, such that control signals to pairs of transistors switches a signal path between a non-phase shifting and a 180 degrees phase shifting path.

A problem with the invention described in U.S. Pat. No. 5,334,959 is that the active units, the field effect transistors, only acts as switches. Moreover, it is in U.S. Pat. No. 5,334,959 necessary that the number of switches, in the form of transistors, is four.

Another problem with the invention described in U.S. Pat. No. 5,334,959 is that all four switches, in the form of transistors, have to be set to a connected condition or to a disconnected condition, which means that there is a need for four control signals.

Yet another problem with the invention described in U.S. Pat. No. 5,334,959 becomes apparent when considering a situation where there is a need for the signal processing units to influence the signal in other ways than only phase shifting. To do this with the technique known from U.S. Pat. No. 5,334,959 it is necessary to connect in series the phase shifting unit with an external signal processing unit. However, this means that two separate units are mutually interconnected, leading to problems of mismatching of input- and output impedances of the respective unit. This in turn leads to a need for impedance matching circuits.

SUMMARY OF THE INVENTION

The present invention is intended to overcome the problems in connection with previously known technique as described above, the single function as switch and the problem of impedance matching.

A purpose with the present invention is thus to enable, with one single circuit comprising a few components, phase shifting of a signal as well as enable other influence on the signal, such as changing the amplitude of the signal. The phase shift should be able to be switched between at least the values 0 and 180 degrees.

A phase shift of a signal by a given number of degrees requires, in an ideal case, that the signal has a well defined frequency. If the signal has a certain bandwidth, that is comprises a superposition of signals with different frequencies, the phase shift is not as well defined for all frequencies in the signal. Consequently, the indicated values of the phase shift, 0 and 180 degrees, should not be interpreted as exact values. Rather, these values should be seen as typical of the phase shift of the frequencies in the frequency interval in question, for the particular application in which the invention is used.

Solutions to the above described problems inherent in previously known technique are obtained with the present invention by way of a parallel connection of two active units, where one of the units is connected in series with a phase shifting unit. By controlling connection and disconnection of the active units, a signal can be made to pass through one of two signal paths, where there is a predetermined difference in phase shift of the signal passing through the two paths.

A more concrete description of a circuit according to the invention is that the signal inputs of two active units are connected to a main signal input of the circuit. The first unit directly connected to the main signal input and the second unit through a phase shifting unit. The signal output of both active units are connected to a main signal output of the circuit. These connections mean that there are two different signal paths through the circuit, from the main signal input to the main signal output. The two active units have at least two different, user configurable, conditions: one connected condition and one disconnected condition. These conditions can, for example, be controlled by a control signal to a control signal input of each unit.

An alternating current input signal to the main signal input of the circuit is, by a method of selecting a combination of connected and disconnected conditions, made to pass through the circuit through one of the two signal paths. Through the first signal path without getting any phase shift, or through the second signal path through the phase shifting unit, with a phase shift relative to the input signal. By setting both of the units in their respective disconnected condition, both of the signal paths can be closed, whereby the circuit acts as an isolator between the main signal input and the main signal output. Any leakage through the active units cancel each other since the leakages are phase shifted relative to each other. Assuredly, the signal can be made to pass simultaneously through both signal paths, by setting both of the active units in their respective connected condition. In such a case, the signals through the signal paths will cancel each other, similar to the situation where possible leakages are canceled when both active units are in their disconnected condition.

An advantage of the present invention is that the impedance matching with external circuits can be common to both signal paths through the circuit, when the phase shift is around 180 degrees through one of the paths. It is thus no need for two different impedance matching circuits to be independently connected depending on which signal path that is used. Formally, the impedance which a signal encounters along the first signal path is not the same impedance as it encounters along the second signal path. This is due to the fact that there are a different number of units influencing the signal along the two paths. Notwithstanding this, it is possible to have a common impedance matching for both signal paths. The phase shifting unit along the second path causes a phase shift of 360 degrees of the signal which due to any mismatching is reflected from the second active unit. That is, two 180 degrees phase shifts, one before the reflection and a second after the reflection.

Another advantage is that, by having a 180 degrees phase shift along one of the paths, it is possible to have complete electric isolation between the input and output of the circuit. In a condition where both signal paths are closed, this isolation is obtained by the fact that the active units along the two signal paths influence the amplitude of the signals in the same way. Any leakage through the two paths have a relative phase shift of 180 degrees, which means that the leakages cancel each other.

Yet another advantage of the invention is that the construction can be implemented with a few components, since it is possible to use active units working both as amplifiers and switches.

The invention will be described below in terms of preferred embodiments and with reference to the enclosed drawings.

DETAILED DESCRIPTION OF PREFERRED EMBODIMENTS

Figure 1:
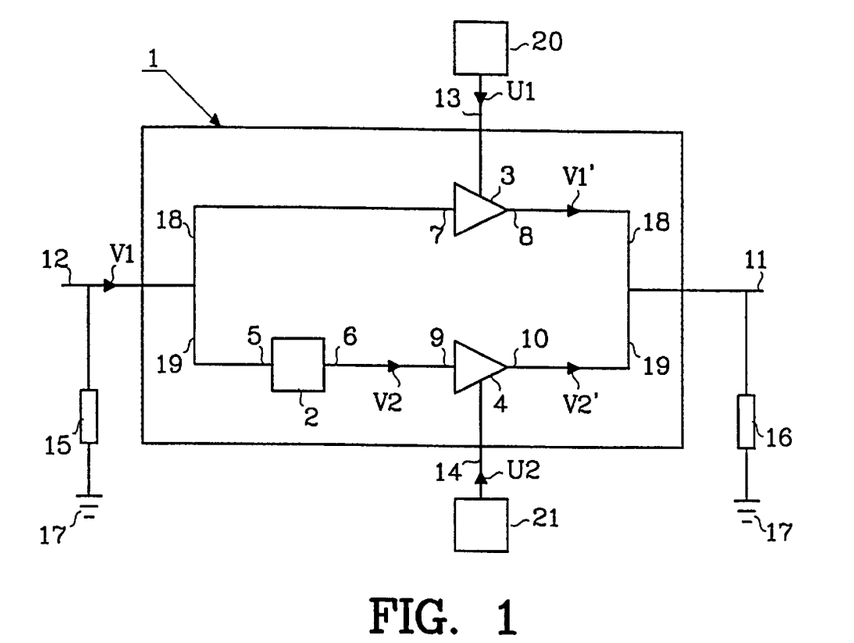
FIG. 1 shows a schematic block diagram of a circuit according to the invention.

FIG. 1 illustrates a circuit 1 according to the invention, schematically with the aid of function blocks and with signals V1,V2,V1',V2' that are further explained in connection with FIG. 2. An input signal V1 arrives at a main signal input 12 of the circuit 1 from an external, not shown, circuit. The signal input 12 is connected to signal ground 17 through a first impedance matching unit 15. Similarly, the circuit 1 has a main signal output 11 with a second impedance matching unit 16. From the output 11 output signals V1' or V2' are conveyed to other, not shown, circuits.

The circuit 1 has two different signal paths 18,19 from the main signal input 12 to the main signal output 11. A first signal path 18 with a first active unit 3, and a second signal path 19 with a phase shifting unit 2 and a second active unit 4. In this example the active units 3,4 are amplifier units, but the units 3,4 can of course be other types of active units which can have other functions than only amplification. Both active units 3,4 have, in addition to signal inputs 7,9 and signal outputs 8,10, also a control signal input 13,14 each. A control signal U1 to the control signal input 13 of the first unit 3 sets the unit 3 into a connected condition, whereby the first signal path 18 is open. A control signal U2 to the control signal input 14 of the second unit 4 sets the unit 4 into a connected condition whereby the second signal path 19 is open. The control signals U1,U2 can be generated in external circuits 20,21 that can be in the form of switches or signal generators.

Both active units 3,4 can, independently of each other, convey the signal V1 and the signal V2 respectively. Thus, there are four different combinations of signal paths through the circuit: only through the first signal path 18, only through the second signal path 19, simultaneously through both signal paths 18,19 and a condition where both the first 18 and the second 19 signal path are closed.

Figure 2:
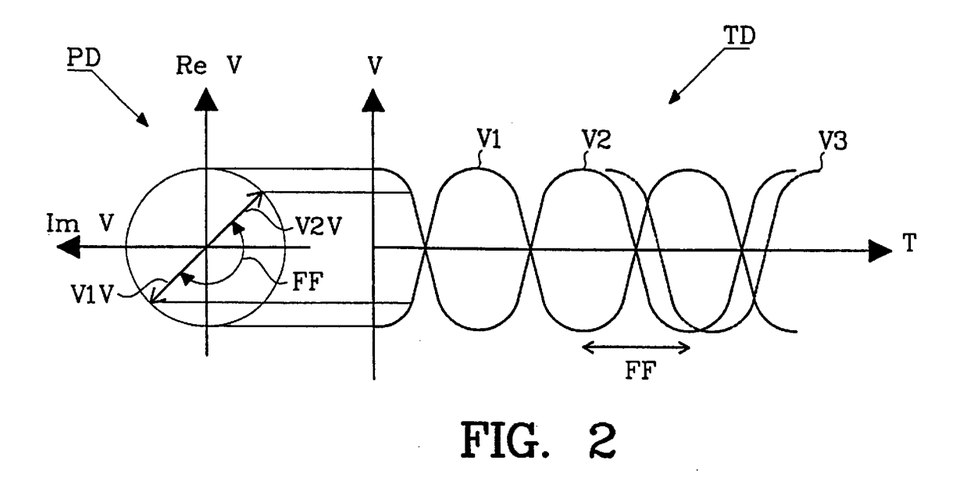
FIG. 2 shows a schematic signal diagram with three signals having relative phase shifts.

FIG. 2 shows diagrams illustrating the alternating current signals V1 and V2. The signals V1,V2 are illustrated as voltage levels V varying with time T in a time diagram TD. A phase shift FF between the signals V1 and V2 is illustrated in the phase diagram PD in such a way that the signals, represented by signal vectors V1V and V2V respectively, are directed in different directions, with an angular difference FF. The phase difference FF can also be seen in the time diagram TD. However, it should be noted that there no particular scale is indicated on the time axis T, since the relation between the phase of a signal and the instantaneous value of the phase depends directly on the frequency of the signal. This is intentional, since the invention as described in FIGS. 1 and 2 can be used in an arbitrary frequency interval.

In the time diagram TD the signal V1 received in the main signal input 12 is represented by the solid curve and in the phase diagram PD by the solid vector V1V. The dotted curve and the dotted vector V2V represent the phase shifted signal V2. In relation to the input signal V1, the signal V2 has a phase shift FF of 180 degrees.

As will be discussed in more detail below in connection with signal frequencies, there may be phase shifts with values that are not exactly 180 degrees. For this purpose an additional curve V3 is shown in the time diagram TD. This curve V3 illustrates the appearance of a signal having a phase shift relative to the input signal V1 other than 180 degrees. However, this signal V3 is only illustrated in FIG. 2.

By selecting which signal path 18,19 the signal V1 is to take through the circuit 1, and using the control signals U1,U2 to connect and disconnect the active units 3,4, the signal V1' or the signal V2' is obtained on the main signal output 11 according to one of the following four alternatives:

The first alternative is that none of the active units 3,4 are in their respective connected condition. The circuit 1 then acts an isolator between the main signal input 12 and the main signal output 11. Any leakage through the active units 3,4 is of the same amount, since the active units 3,4 preferably are identical and thus influence signals identically. Due to the fact that any leakage through the lower signal path 19 is phase shifted 180 degrees in the phase shifting unit 2, the leakages cancel each other at the main signal output 11.

The second alternative is that both active units 3,4 are in their respective connected condition. Although this alternative may seem as more or less unusable, it is appropriate to describe what takes place in the circuit 1 if the alternative should be considered. There is nothing which precludes the use of this second alternative. The circuit 1 acts in this case as a "virtual isolator". Analogous to the possible leakage in the first alternative above, the signal V1' through the first signal path 18 will be canceled at the main signal output 11 by the 180 degrees phase shifted signal V2' passing through the lower signal path 19. Even if both signal paths are open, and the circuit 1 thus not being an isolator between the main signal input 12 and output 11, no signal will pass through the circuit 1.

The third alternative is that only the first signal path 18 is open, due to the first active unit 3 being in its connected condition and the second active unit 4 being in its disconnected condition. The input signal V1 is in this case conveyed to the main signal output 11 without being phase shifted. With reference to the time diagram TD in FIG. 2, the output signal V1' is represented by the signal V1 shown in the diagram TD.

The fourth alternative is that only the second signal path 19 is open, due to the second active unit 4 being in its connected condition and the first active unit 3 being in its disconnected condition. The input signal V1 is in this case conveyed to the main signal output 11 through the phase shifting unit 2. With reference to the time diagram TD in FIG. 2, the output signal V2' is represented by the signal V2 in the diagram TD which is phase shifted 180 degrees relative to the input signal V1.

In the two latter alternatives, where only one of the signal paths 18,19 is open, disturbing signal noise may occur at the main signal input 12, due to the fact that the input signal V1 at least partly can be reflected at the inputs 7,9 of the active units 3,4. Reflection may occur because the two signal paths 18,19 are both connected to the main signal input 12 and that the first impedance matching unit 15 has an impedance value which together with the total impedance along the first signal path 18, may be of another value than the sum of impedances along the second signal path 19. When the first impedance matching unit 15 has a fixed impedance value, at least one of the signal paths 18,19 will be mismatched with respect to the external circuits, not shown, connected to the main signal input 12.

This potential problem with reflection/impedance mismatch is not an issue in the two first alternatives above, where leakage and signals through the active units 3,4 cancel each other at the main signal output 11. However, this problem is avoided also in the two latter alternatives due to the fact that the phase shifting unit 2 shifts the phase of the input signal V1 by 180 degrees. When only the first of the signal paths 18 is open, a fraction of the input signal V1 reflected at the signal input 9 of the second active unit 4, being in its disconnected condition, will not disturb the input signal V1. At the main signal input 12 there will be a 360 degrees phase shift between the reflected fraction of the input signal V1 and the input signal V1 itself, since the reflected fraction passes through the 180 degrees phase shifting unit 2 twice.

In all four alternatives described above it was only discussed the influence of the different signal paths 18,19 on the relative phase between the output signals V1',V2' and the input signal V1. The only function of the active units 3,4 discussed so far is their respective connecting and disconnecting capabilities and to some extent their amplification. Naturally, the active units 3,4 may possess further capabilities of influencing the signals passing through, such as filtering, modulation etc., in addition to the connecting/disconnecting capability and the amplification.

The description above of the invention in terms of blocks having different functions, illustrates two of the disclosed advantages: the advantage of a common impedance matching unit 15 at the main signal input 12 and the advantage of the fact that any leakage of signals cancel at the main signal output 11.

Figure 5:
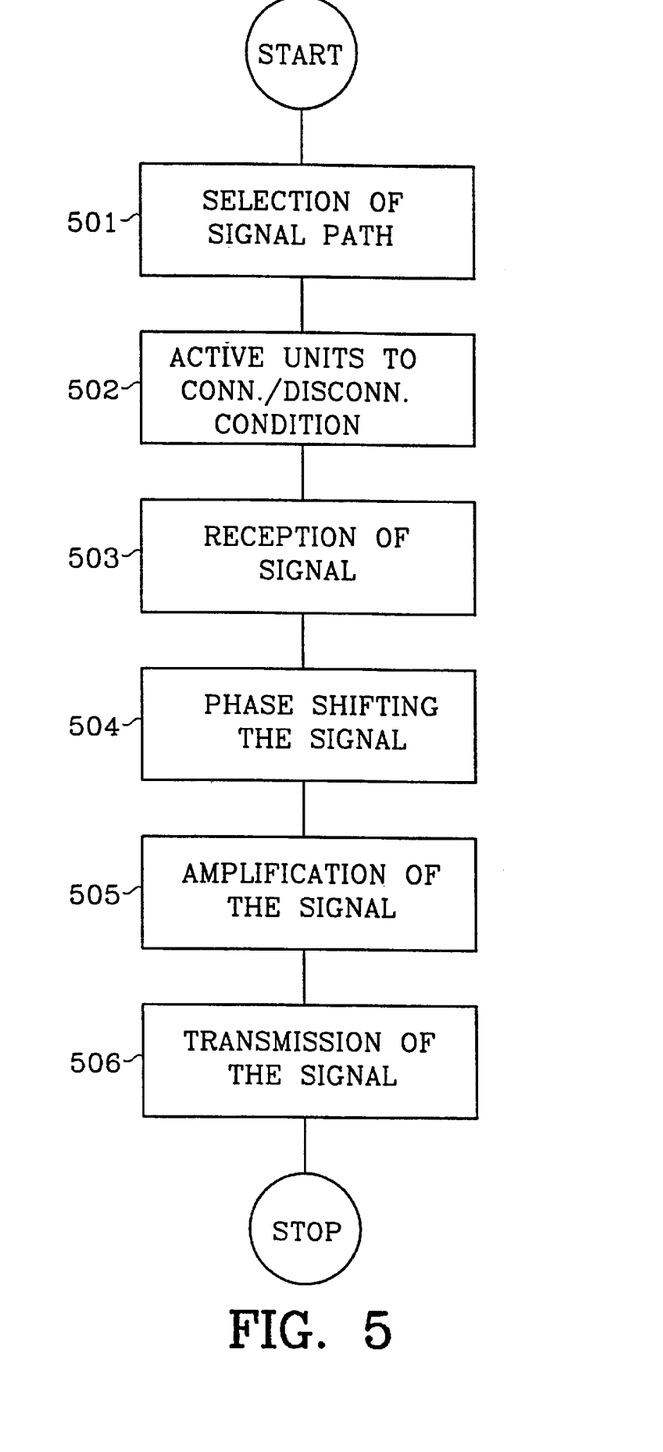
FIG. 5 shows a schematic flow chart of a method according to the invention.

In FIG. 5 it is shown a method according to the invention, where, by using the above described circuit 1, the input signal V1 is conveyed from the main signal input 12 to the main signal output 11 with a phase shift of 180 degrees. The method comprises the following steps:

In a first step 501 a selection is made of the second signal path 19. This selection is made with the purpose of conveying the input signal V1 through the circuit 1 according to the fourth of the alternatives described above. The selection can for example be of such a character that it is a decision made by a user of the circuit 1. But the selection can also be of an automatic character, such that the external circuits 20,21 generate the control signals U1,U2 depending on the function of the external circuits 20,21.

Depending on the selection made in the previous step 501, the first active unit 3 is in the next step 502 set to its disconnected condition and the second active unit 4 is set to its connected condition. The setting of the active units 3,4 in their respective connected and disconnected conditions can, for example, be made by sending control signals U1,U2 to their respective control signal input 13,14.

In the next step 503, the input signal V1 is received at the main signal input 12. The input signal V1 may already, before this step 503, have been sent to the main signal input 12 from the external, not shown, circuits.

In the next step 504, the signal V1 is phase shifted 180 degrees in the phase shifting unit 2. In practice, this may mean, as described above, that the signal V1 is delayed in the phase shifting unit 2. When the signal V1 has passed through the unit 2 the phase shifted signal V2 is conveyed to the second active unit 4.

In the next step 505 the signal V2 is conveyed through the second active unit 4, whereby the signal V2 is amplified.

In a concluding step 506 the signal V2' is conveyed to other, not shown, circuits by transmitting the signal V2' from the main signal output 11.

Figure 3:
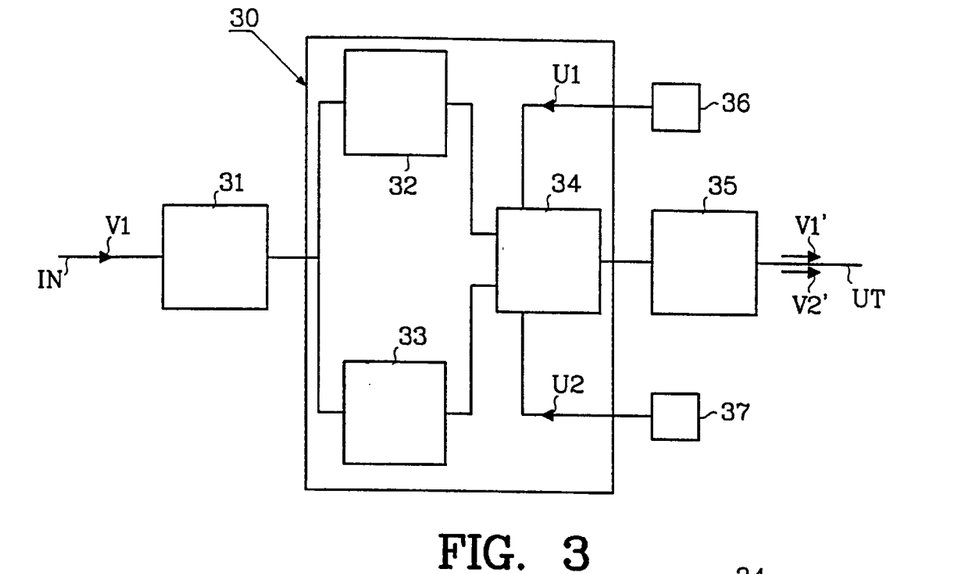
FIG. 3 shows a schematic block diagram of a circuit according to the invention.
Figure 4:
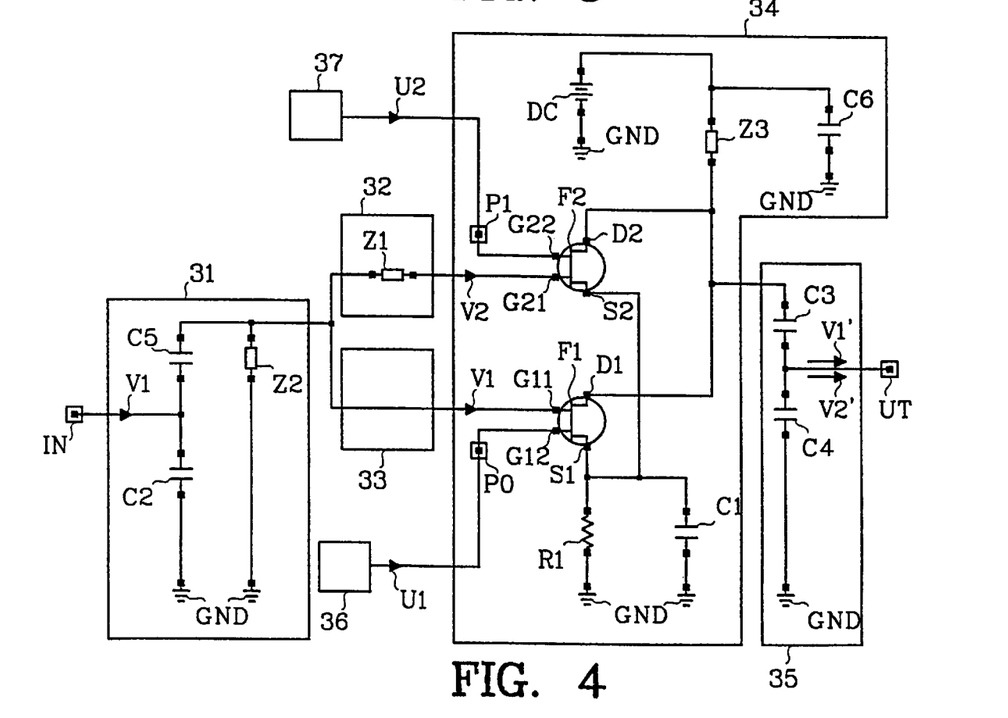
FIG. 4 shows a schematic circuit diagram of a circuit according to the invention.

FIGS. 3 and 4 show a preferred embodiment in which the invention is implemented by means of discrete components. Of course, one skilled in the art will recognize that the circuits in FIGS. 3 and 4 can be implemented in an integrated circuit, or with parts of the circuits implemented on an integrated circuit and parts of the circuits implemented using discrete components. FIG. 3 shows a block diagram and FIG. 4 shows the corresponding circuit diagram in which the components are shown.

A first impedance matching unit 31 comprising a main signal input IN is connected to a combined phase shifting and active unit 30. The combined phase shifting and active unit 30 comprises three units: a phase shifting unit 32, a non-phase shifting unit 33 and an amplifier unit 34. A second impedance matching unit 35 is connected to the amplifier unit 34 and comprises a main signal output UT. To the amplifier unit 34 is also connected two control signal generators 36,37 that can generate the control signals U1 and U2 respectively.

The first impedance matching unit 31 comprises two capacitance units C2,C5 connected in series. An impedance unit Z2 is connected in parallel with the two capacitance units C2,C5, to signal ground GND.

The non-phase shifting unit 33 consists of the signal path from the first impedance matching unit 31 to the amplifier unit 34. In spite of the fact that this unit 33 comprises no particular components, it is nevertheless shown as a separate block in FIG. 4. The phase shifting unit 32 consists of an impedance unit Z1, which in a simple implementation may consist of a delay line. By the fact that the length of the signal path through the phase shifting unit 32 is sufficiently longer than the signal path through the non-phase shifting unit 33, the signal V1 is delayed a time interval corresponding to the phase shift FF of 180 degrees shown in the time diagram TD in FIG. 2. The exact length of the delay line (the impedance unit Z1) depends thus on the frequency of the signal V1. The frequency dependence of the invention is discussed further below.

The amplifier unit 34 has two field effect transistors F1,F2 with dual gates, a first gate G11 and G21 respectively and a second gate G12 and G22 respectively. Connected to the first gate G11 of the first transistor F1 is the non-phase shifting unit 33, and connected to the first gate G21 of the second transistor F2 is the phase shifting unit 32. The second gate G12 of the first transistor F1 is connected to a first control signal input P0 and the second gate G22 of the second transistor F2 is connected to a second control signal input P1. Connected to these two control signal inputs P0,P1 are the two external signal generators 36 and 37 that can generate the control signals U1 and U2 respectively. The first transistor F1 has a drain D1 which is connected to a drain D2 of the second transistor F2. These two drains D1,D2 are connected to a direct current source DC through an impedance unit Z3. The direct current source DC is connected in parallel with a capacitance unit C6 to signal ground GND. The two transistors F1,F2 each have a source, S1 and S2 respectively, that are connected to each other and connected to signal ground GND through a resistor R1 in parallel connection with a capacitance unit C1.

The main signal output UT is through the second impedance matching unit 35 connected to the mutually connected drains D1,D2 of the two transistors F1,F2. This second impedance matching unit 25 comprises two capacitance units C3,C4 connected in series to the signal ground GND. The impedance unit Z3 is part of this second impedance matching unit 35 as well as being part of the amplifier unit 34, as described above.

The two transistors F1,F2 can each be set in a connected condition by a positive voltage, in the form of the control signals U1 and U2, applied from the signal generators 36 and 37 to the second gate G12 and G22 of respective transistor F1 and F2. In their connected condition, a signal to the first gate G11,G21 of each transistor F1,F2 is capable of controlling a current through respective transistor, from the source S1,S2 to the drain D1,D2. A voltage level on the drain D1,D2 of respective transistor F1,F2 is proportional to the input signal V1, with an amplifying factor given by the characteristics of the transistor F1,F2, the impedance Z3 and the resistance of the resistor R1.

The transistors F1,F2 can each also be set to a disconnected condition by a negative voltage potential applied to the second gate G12,G22 of respective transistor F1,F2. In the disconnected condition no current is flowing from the source S1,S2 to the drain D1,D2 of respective transistor F1,F2, whereby the main signal input IN is isolated from the main signal output UT.

The input signal V1 arrives at the main signal input IN, passes through the first impedance matching unit 31 and further to the phase shifting unit 32 and the non-phase shifting unit 33. Depending on which of the transistors F1,F2 in the amplifier unit 34 is in its connected condition, the signal V1 will flow through the transistors F1,F2 amplified by an amplification factor as discussed above. The second impedance matching unit 35 is connected to the drains D1,D2 of the transistors F1 and F2 respectively. One of the output signals V1' or V2' emanates from the main signal output UT of this second impedance matching unit 35, depending on which of the signals V1 or V2 that comes from the amplifier unit 34.

This example of an implementation shows how compact, that is comprising few components, an arrangement according to the invention can be made.

Figure 6:
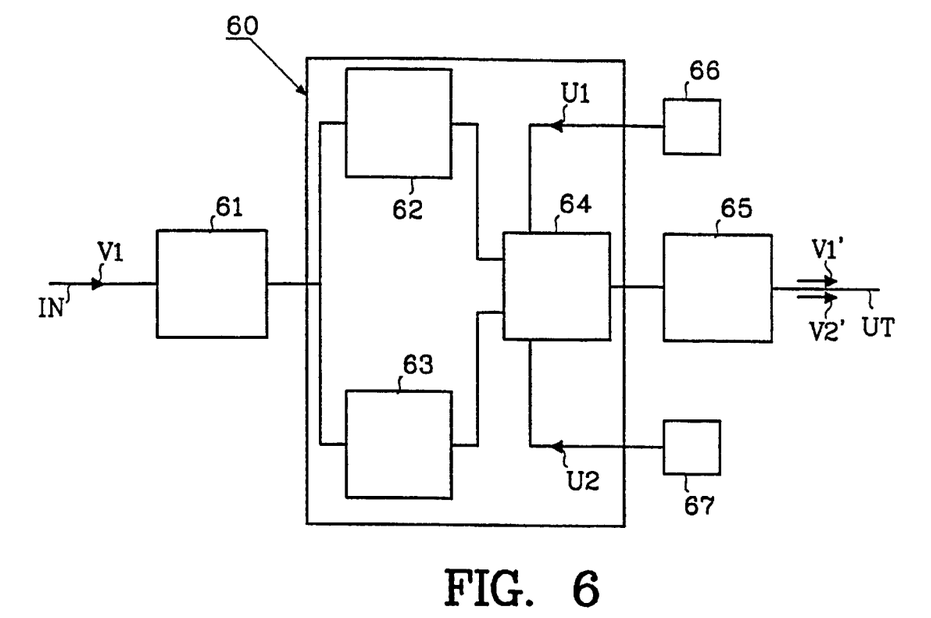
FIG. 6 shows a schematic block diagram of a circuit according to the invention.
Figure 7:
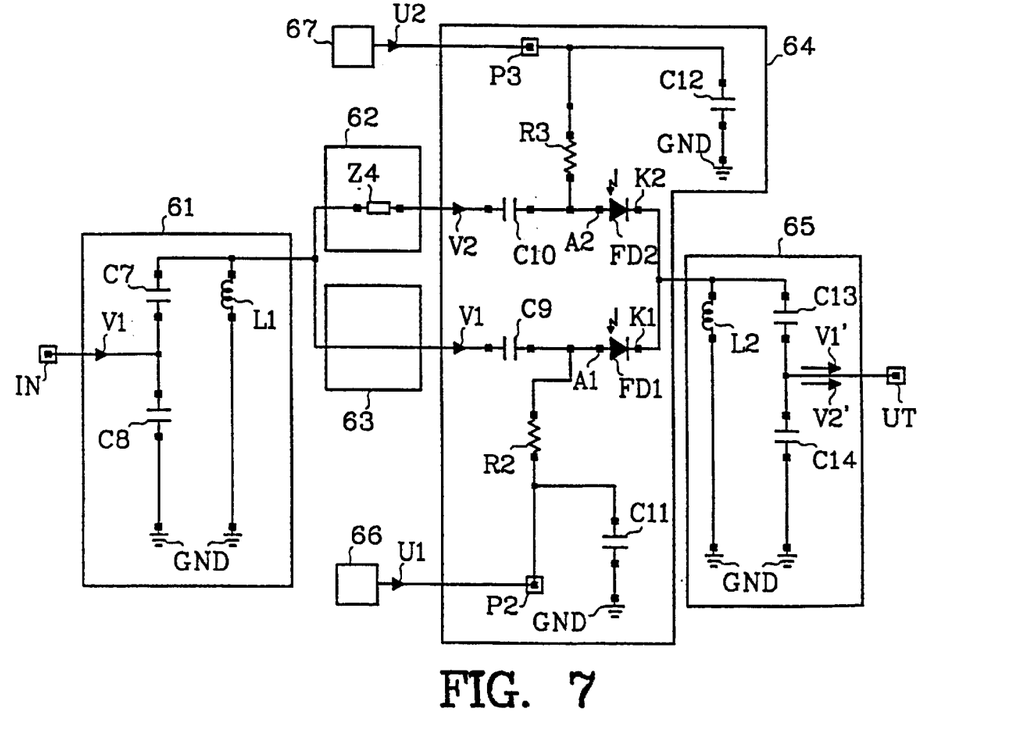
FIG. 7 shows a schematic circuit diagram of a circuit according to the invention.

Another arrangement in which the invention is implemented using discrete components is shown in FIGS. 6 and 7. Of course, one skilled in the art will recognize that the circuits in FIGS. 3 and 4 can be implemented in an integrated circuit, or with parts of the circuits implemented on an integrated circuit and parts of the circuits implemented using discrete components. Similar to the previous example, FIG. 6 shows a block diagram and FIG. 7 shows the corresponding circuit diagram where the components are shown.

A first impedance matching unit 61 comprising a main signal input IN is connected to a combined phase shifting and active unit 60. The combined phase shifting and active unit 60 comprises three units: a phase shifting unit 62, a non-phase shifting unit 63 and a diode unit 64. A second impedance matching unit 65 is connected to the diode unit 64 and comprises a main signal output UT. To the diode unit 64 is also connected two control signal generators 66,67 that can generate the control signals U1 and U2 respectively.

The first impedance matching unit 61 comprises two capacitance units C7,C8 connected in series. An inductance unit L1 is connected in parallel with the two capacitance units C7,C8, to signal ground GND.

The phase shifting unit 62 consists of an impedance unit Z4, which in a simple implementation may consist of a delay line as in the previous example. The non-phase shifting unit 63 consists, in a simple way, of the signal path from the first impedance matching unit 61 to the diode unit 64. In spite of the fact that this unit 63 comprises no particular components, it is for the sake of clarity shown as a separate block in FIGS. 6 and 7.

The diode unit 64 comprises a first photo diode FD1 and a second photo diode FD2. To the anode A1 of the first diode FD1 is the non-phase shifting unit 63 connected through a capacitance unit C9. To the anode A2 of the second diode FD2 is the phase shifting unit 62 connected through a capacitance unit C10. The anodes A1,A2 of both diodes FD1,FD2 are also connected to a first control signal input P2 and a second control signal input P3, through resistance units R2 and R3, respectively. The external signal generators 66,67, capable of generating control signals U1,U2, are connected to the first and second control signal inputs P2,P3 respectively. Both control signal inputs P2,P3 are also connected to signal ground GND through capacitance units C11 and C12, respectively. The diodes FD1,FD2 have cathodes, K1 and K2 respectively, that are connected to each other as well as being connected to a second impedance matching unit 65.

The main signal output UT is connected to the cathodes K1,K2 of the diodes FD1,FD2 through the second impedance matching unit 65. This second impedance matching unit 65 comprises two capacitance units C13,C14 connected in series to signal ground GND and a second inductance unit L2 connected in parallel with these impedance units C13, C14.

The two photo diodes FD1,FD2 can each be set in a connected condition by a positive voltage, in the form of the control signals U1 and U2, applied from the signal generators 66 and 67 to the control signal inputs P2,P3 which in turn are connected to respective diode FD1 and FD2. In their respective connected condition, the diodes FD1,FD2 let the signals V1,V2 arriving at the anode A1,A2 of respective diode FD1,FD2 to pass through. If the photo diodes FD1, FD2 are illuminated with varying light, not shown, the signal V1,V2 passing through respective diode be modulated in tune with the light variation. A further description of the usage of the photo diodes FD1,FD2 as light detectors is outside the scope of the invention, and is only indicated here with the purpose of illustrating an electrically active unit 64.

The diodes FD1,FD2 can each also be set in a disconnected condition by a negative voltage applied to the anode A1,A2 of respective diode FD1,FD2 via the control signal inputs P2,P3 and the resistors R2 and R3. In the disconnected condition no signal V1,V2 passes through respective diode FD1,FD2, whereby the main signal input IN is isolated from the main signal output UT.

The input signal V1 arrives at the main signal input IN, passes trough the first impedance matching unit 61 and further to the phase shifting unit 62 and the non-phase shifting unit 63. Depending on which of the photo diodes FD1, FD2 in the diode unit 64 is in its connected condition, the signal V1 will flow through the diodes FD1,FD2 modulated by the variation in the incident light on respective diode FD1,FD2. The second impedance matching unit 65 is connected to the cathodes K1,K2 of the diodes FD1 and FD2 respectively. One of the output signals V1' or V2' emanates from the main signal output UT of this second impedance matching unit 65, depending on which of the signals V1 or V2 that comes from the diode unit 64.

A relevant parameter for the invention, as described in the examples above, is the frequency of the signal V1. Nevertheless, so far no value of the frequency has been discussed, with the effect that no absolute numbers have been given of the impedance, resistance and capacitance values. This is intentional, bearing in mind that there are different fields of application between which the frequency of the signals may differ with several decades. As discussed above, the phase shifting unit 32,62 can be in the form of a delay line. In order to obtain a time delay of an electric signal corresponding to a phase shift of 180 degrees, while keeping the physical dimensions within reasonable limits, the frequency of the signal should be at least a few hundred megahertz (MHz). However, that limitation is not an issue if the 180 degrees phase shift can be obtained by some other method than through a delay line.

An example of a circuit intended for 180 degrees phase shift and amplification of signals having frequencies around 890 MHz, connected according to FIG. 4, can comprise the following components:

Field effect transistors:
  F1: 3SK240 F2: 3SK240
Capacitance units:
  C1: 33 pF C2: 2.7 pF C3: 1 pF C4: 4.7 pF
  C5: 2.7 pF C6: 33 pF
Impedance and resistance units:
  R1: 470 Ohm
  Z1: 69 Ohm 94.5 mm long delay line
  Z2: 69 Ohm Z3: 69 Ohm A circuit intended for other frequencies will obviously have components with other values than the above.

An example of an application in which a circuit according to any of the examples above may be a part, is a radio receiver. The signal V1 to the main signal input IN may in such a case be a signal from an antenna connected to the main signal input IN. The input signal V1 can in such a case be a superposition of signals having a number of different frequencies within a frequency interval DF. The frequency interval DF is delimited by a lower frequency F0 and an upper frequency F1. In order to obtain a phase shift of about 180 degrees, as in the examples above, it is necessary for the frequency interval DF to be much smaller than the lowest frequency F0 in the interval DF. Frequencies outside the interval DF will be phase shifted more than 180 degrees, or less than 180 degrees, depending on whether the frequency is higher than the upper limit F1 or lower than the lower limit F0, respectively.

From this reasoning it follows that it is not necessary, within the framework of the invention, to specify the absolute value of the frequency interval DF and the limits F0 and F1. Different requirements may be present in the application in which the invention forms part, in terms of the question whether frequencies close to the interval limits F0,F1 should be allowed to pass through the circuit with phase shifts other than 180 degrees. If the requirements are strict, only a small interval DF may be allowed, and if the requirements are less strict, a relatively wider interval DF may be allowed.

What is claimed is:

1. A phase shifting electric circuit comprising:
   a main signal input to which an alternating current input signal arrives;
   a main signal output from which an alternating current signal is transmitted;
   at least one phase shifting unit for shifting the phase of the outut signal relative to the input signal by about 180 degrees, the phase shifting unit comprising a signal input connected to the main signal input, and a signal output;
   a first electrically active unit comprising:
     a signal input connected to the main signal input; and
     a signal output connected to the main signal output;
   a second electrically active unit comprising:
     a signal input connected to the signal output of the phase shifting unit; and
     a signal output connected to the main signal output;
   an input impedance matching circuit, wherein the input impedance matching circuit is connected to the main signal input and is diretly connected to both the phase shifting unit and the first electrically active unit; and
   an output impedance matching circuit, wherein the output impedance matching circuit is connected to the main signal output and is directly connected to the signal outputs of both of said first and second electrically active units,
   wherein the first electrically active unit in its connected condition to the main signal output is arranged to output an output signal which has the same phase as the input signal, and the second electrically active unit in its connected condition to the main signal output is arranged to output an output signal which has a predetermined phase shift relative to the input signal, said phase shift being determined by the phase shifting unit; and
   wherein the first and second electrically active units each comprises an amplifier unit.

2. A phase shifting electric circuit according to claim 1, wherein the active units have control signal inputs intended for reception of control signals controlling the connection and disconnection condition of the units.

3. A phase shifting electric circuit according to claim 1, wherein the phase shifting unit comprises a delay line.

4. A phase shifting electric circuit according to claim 1, wherein the two electrically active units have identical electrical characteristics.

5. A phase shifting electric circuit according to claim 1, wherein the phase shifting electric circuit is comprised in an integrated circuit.

6. A phase shifting electric circuit according to claim 1, wherein the phase shifting electric circuit comprises discrete components.

7. A phase shifting electric circuit according to claim 1, wherein the phase shifting electric circuit comprises discrete components and at least one integrated circuit.

8. A method for phase shifting an alternating current signal at an electric circuit, where a first connectable and disconnectable active unit is connected between a main signal input and a main signal output of the circuit thus forming a first signal path through the circuit, where a phase shifting unit is connected in series with a second connectable and disconnectable active unit, said phase shifting unit and said second active unit are connected between the main signal input and the main signal output of the circuit thus forming a second signal path through the circuit, said method comprising the steps:

selection of signal path;

setting the active units each in a connected or disconnected condition, depending on the selection of signal path, wherein the first and second active units each comprises an amplifier unit;

reception of the alternating current signal at the main signal input;

phase shifting the signal by about 180 degrees;

emission of an output signal from at least one of the active units;

transmission of the output signal from the main signal output;

wherein the main signal input is connected to a input impedance matching circuit, and the input impedance matching circuit is directly connected to both the phase shifting circuit and the first electrically active unit; and     wherein the main signal output is connected to an output impedance matching circuit, and the output impedance matching circuit is directly connected to the signal outputs of both of said first and second electrically active units,     whereby the first active unit in its connected condition to the main signal output is arranged such that the output signal transmitted from the main signal output has the same phase as the alternating current signal received by the main signal input.

9. A method for phase shifting an alternating current signal according to claim 8, where the active units comprise:

control signal inputs wherein the setting of the active units in their connected and disconnected condition is controlled by control signals to the control signal inputs of respective units.

10. A method for phase shifting an alternating current signal according to claim 8, wherein the phase shift is done by delaying the signal.

11. A phase shifting electric circuit comprising:

a main signal input to which an alternating current input signal arrives;

a main signal output from which an alternating current signal is transmitted;

at least one phase shifting unit comprising
        a signal input directly connected to an input impedance matching circuit, wherein the input impedance matching circuit is connected to the main signal input, and
        a signal output,     a first electrically active unit comprising:
        signal input directly connected to the input impedance matching circuit; and
        a signal output directly connected to an output impedance matching circuit, wherein the output impedance matching circuit is connected to the main signal outputs;

a second electrically active unit comprising:
        signal input connected to the signal output of the phase shifting units; and
        a signal output which is directly connected to the output impedance matching circuit; wherein the first electrically active unit in its connected condition to the main signal output is arranged to output an output signal which has the same phase as the input signal, and the second electrically active unit in its connected condition to the main signal output is arranged to output an output signal which has a phase shift of about a 180 degrees relative to the input signal, said phase shift being determined by the phase shifting unit; and     wherein the first active unit comprises either a first amplifier unit or a first modulation unit and the second active unit comprises either a second amplifier unit or a second modulation unit.

12. A phase shifting electric circuit according to claim 11, wherein the first and second active units are the first and second modulation units, the first and second modulation units each comprises a photo diode, wherein the photo diodes modulate a signal at their respective signal input in accordance with variations of light.

\* \* \* \* \*